United States Patent [19]

Takeshima

[11] 4,397,368

[45] Aug. 9, 1983

[54] DRIVING CIRCUITS OF SOLENOID ACTUATED DEVICES

[75] Inventor: Sadao Takeshima, Higashimatsuyama, Japan

[73] Assignee: Jidosha Kiki Co., Ltd., Japan

[21] Appl. No.: 13,718

[22] Filed: Feb. 21, 1979

[30] Foreign Application Priority Data

Mar. 6, 1978 [JP] Japan .................................. 53/24441

[51] Int. Cl.³ .................. B62D 5/00; F15B 9/09; H03F 1/36; H01H 47/32
[52] U.S. Cl. .................................. 180/143; 318/628; 318/637; 330/104; 361/170
[58] Field of Search .................. 180/141, 142, 143; 330/104, 112; 318/637, 628; 361/170

[56] References Cited

U.S. PATENT DOCUMENTS 3,654,444 4/1972 Gurol .................................. 318/637
3,745,420 7/1973 Häfner .................................. 361/203

FOREIGN PATENT DOCUMENTS 52-31427 3/1977 Japan .

Primary Examiner—Joseph F. Peters, Jr.
Attorney, Agent, or Firm—Townsend and Townsend

[57] ABSTRACT

In a solenoid actuated device for controlling the oil supplied to a power steering unit of a motor car, a driving circuit is provided to pass current through the solenoid. The driving circuit comprises a comparator supplied with an analogue control signal proportional to the running speed of the motor car, a power amplifier including an output transistor which supplies exciting current to the solenoid coil in response to the output of the comparator. A positive feedback resistor is connected between the output of the comparator and the input thereof to which the analogue signal is applied, and a negative feedback resistor is connected between the output of the power amplifier another input of the comparator thereby ON-OFF controlling the output transistor to pass pulse current through the solenoid coil.

5 Claims, 4 Drawing Figures

DRIVING CIRCUITS OF SOLENOID ACTUATED DEVICES

BACKGROUND OF THE INVENTION

This invention relates to a driving circuit of a solenoid actuated device wherein a plunger is moved in the axial direction of a cylinder by passing current through a solenoid coil wound about the cylinder.

One example of such solenoid actuated device is disclosed in Japanese laid open patent specification No. 31427/1977 dated Mar. 9, 1977. The device disclosed therein is used to control the opening of an oil pressure control valve in accordance with the running speed of a motor car. A driving circuit is provided to pass current through a solenoid coil corresponding to the running speed.

In order to move a plunger which is operatively connected to an oil pressure control valve it is necessary to pass a current of about 0.6 ampere through the solenoid coil from a source of 16 V, for example, and the solenoid coil is connected to the output of a transistor. Considering the loss of the transistor, the source is required to have a capacity sufficient to supply the necessary power to the solenoid coil and the power loss of the transistor. Such output transistor is necessary to be provided with heat radiating fins so that it size is not only bulky but also requires a large space.

SUMMARY OF THE INVENTION

It is an object of this invention to provide an improved driving circuit for a solenoid actuated device capable of efficiently driving the output transistor thereby reducing its size.

According to this invention there is provided a driving circuit of a solenoid actuated device of the type wherein a plunger is actuated by a solenoid coil, the driving circuit comprising a comparator supplied with an analog control signal representing an operating condition of a member to be controlled by the plunger, a power amplifier circuit including an output amplifier in the form of an output transistor which supplies exciting current to the solenoid coil in response to the output of the comparator, a positive feedback resistor connected between the output of the comparator and the input thereof to which the analog control signal is applied, and a negative feedback resistor connected between the output of the output amplifier circuit and another input of the comparator thereby ON-OFF controlling the output transistor.

BRIEF DESCRIPTION OF THE DRAWINGS

In the accompanying drawings.

DESCRIPTION OF THE PREFERRED EMBODIMENTS

Figure 1:
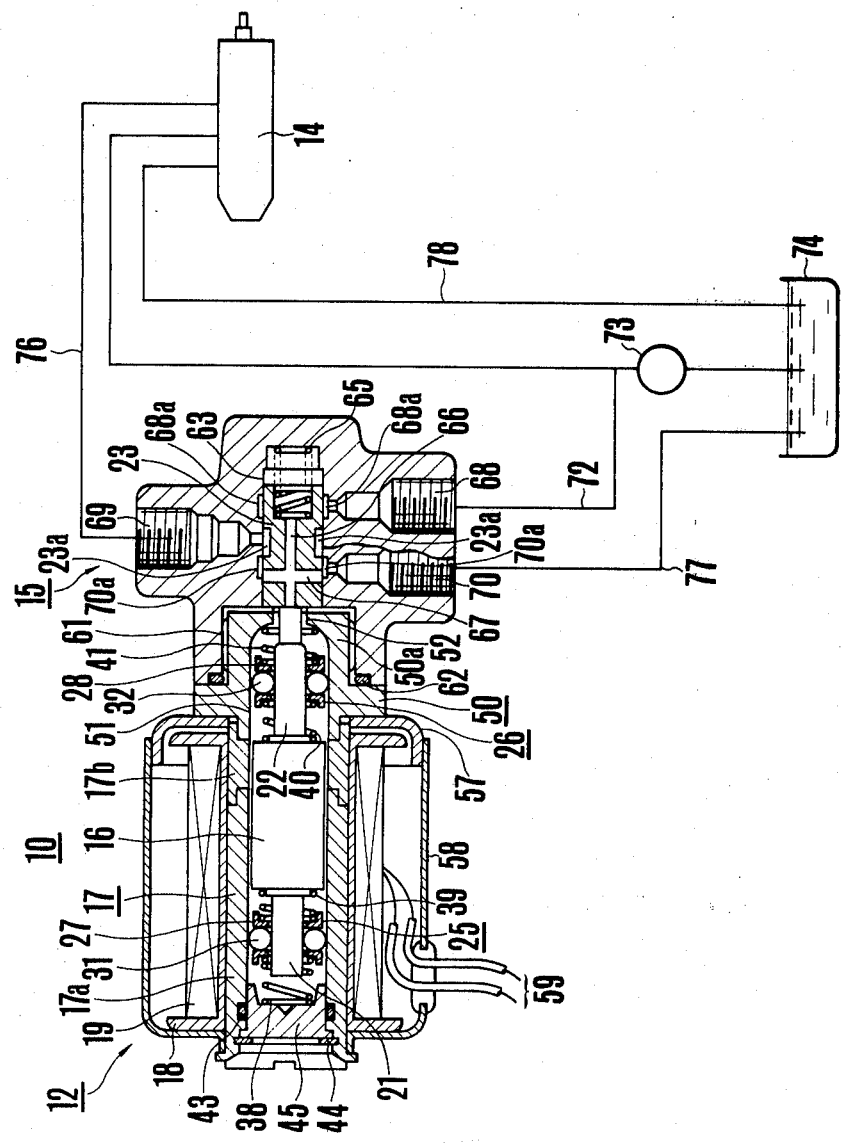
FIG. 1 shows an oil pressure control device for a power steering unit of a motor car to which the driving circuit of this invention is applicable.

FIG. 1 shows a solenoid actuated device 12, an oil pressure control device 15 including a spool valve operated by the plunger of the solenoid actuated device, and a power steering unit 14 of a motor car controlled by the oil pressure control device 12.

The solenoid actuated device 12 comprises a cylindrical plunger 16 contained in a cylinder 17, a bobbin 18 mounted on the cylinder and a solenoid coil 19 wound about the bobbin 18. The plunger 16 has an outer diameter slightly smaller than the inner diameter of the cylinder 17 and is provided with guide rods 21 and 22 axially extending from the opposite ends. The outer end of the guide rod 22 is maintained in contact with the spool of the oil pressure control device 15 in a manner to be described later. The plunger 16 is provided with bearings 25 and 26 mounted on the guide rods 21 and 22 to be moved therealong. The bearings 25 and 26 comprise cylindrical bearing members 27 and 28 respectively. Each cylindrical bearing member has an inner diameter larger than the outer diameter of the guide rod and provided with a plurality of circumferentially spaced radial perforations to rotatably receive steel balls 31 and 32. These steel balls have diameters such that the inner portions of the balls engage the peripheries of the guide rods while the outer portions engage the inner wall of the cylinder 17. Bearings 25 and 26 are provided with flanges at one ends thereof to receive one ends of springs 38, 39, 40 and 41 respectively. More particularly, spring 39 is interposed between bearing 25 and plunger 16 whereas spring 40 is interposed between plunger 16 and bearing 26. The other end of spring 38 is supported by a spring seat 45 inserted into the cylinder 17 through an O-ring 43 and secured to one end of the cylinder 17 by a clamping ring 44. The cylinder 17 is constituted by a cylindrical member 17a made of magnetic material, a cylindrical member 17b made of nonmagnetic material and a cylindrical recess 51 in a base 50. A spring 41 is contained in the recess 51 with one end engaged with the bearing 26 and the other end seated in the bottom of the recess 51. A spool valve 23 operated by the plunger 16 extends into an axial opening 52 at the bottom of the recess 51. A yoke 57 is connected to the cylindrical portion 17b to form the magnetic circuit for the solenoid coil and a cover 58 is provided to surround the solenoid coil 19. Current is supplied to the solenoid coil 19 through terminals 59.

The axial projection 50a of the base 50 is received in an opening 61 of the oil pressure control device 15 through an O-ring 62. At the bottom of the opening 61 is formed a blind hole 63 coaxial with the guide rod 22, and a spool valve 23 is slidably contained in the blind hole 63. The lefthand end of the spool valve 23 opposes the guide rod 22 and the righthand end is engaged by a spring 65 so as to be normally biased toward the left. The cylindrical spool valve 23 is provided with an axial through opening 66 and a radial opening 67 intersecting the through opening 66 at right angles. The oil pressure control device 15 is provided with an inlet port 68 extending from the outer wall to the blind hole 63, and first and second discharge ports 69 and 70. The inlet port 68 is connected to an oil reservoir 74 through a conduit 72 and an oil pump 73. The first discharge port 69 is connected to the power steering unit 14 particularly to the oil pressure reaction chamber via conduit 76, whereas the second discharge port 70 is connected directly to the reservoir 74 through a conduit 77. The oil in the operating chamber of the power steering unit 14 is returned to the reservoir 14 through pipe 78.

An annular groove 68a is formed in the inner wall of the opening 63 at a portion facing the inlet port 68 and a similar annular groove 70a is formed in the inner wall of the opening 63 at a portion facing the second discharge port 70. An annular groove 23a is formed at the center of the outer periphery of the spool valve 23. This groove 23a cooperated with the first discharge port 69 and the annular grooves 68a and 70a to form a valve.

When a control signal (current) corresponding to the car speed is supplied to the solenoid coil 19 in a manner to be described later, the plunger 16 is moved to the right in proportion to the magnitude of the control signal. Consequently, the spool valve 23 is moved to the right to control the flow of oil between grooves 70a and 23a and between grooves 23a and 68a, thus controlling the flow of oil to the power steering unit 14. As a consequence, the reaction to the steering handle is controlled.

The driving circuit of the oil pressure control device 10 shown in FIG. 1 will now be described with reference to FIG. 2. The drive circuit shown therein comprises a well known sensor 111 which detects the running speed of the motor car and a pulse shaping circuit 112 which shapes the waveform of the pulse generated by the sensor 111. The pulse shaping circuit 112 comprises an operational amplifier $112_1$, resistors $112_2$ through $112_5$ and a capacitor $112_6$, and the frequency characteristic of the pulse is improved by an integrating circuit constituted by the resistor $112_2$ and capacitor $112_6$. Then the pulse is applied to the negative input terminal of the operational amplifier $112_1$. A resistor $112_4$ is connected between the output terminal and the positive input terminal of the operational amplifier $112_1$ to provide a positive feedback circuit. As a consequence, the operational amplifier produces an output proportional to the running speed and whose waveshape has been shaped. This output is supplied to a digital-analog converter through a coupling capacitor 113 to be converted into an analog signal proportional to the running speed. The digital analogue converter 114 comprises rectifying diodes $114_1$ and $114_2$, a smoothing capacitor $114_3$ and a resistor $114_4$, and the analog output of the digital analog converter 114 is applied to a filter 115 and smoothed.

The filter 115 comprises an operational amplifier $115_1$, resistors $115_2$ through $115_7$, and capacitors $115_8$ and $115_9$, and the output of the filter 115 is taken out from a junction between the resistors $115_6$ and $115_7$ and supplied to a power amplifier 117 which energizes the solenoid coil 19. The power amplifier 117 comprises an operational amplifier $117_1$, a NPN transistor $117_2$, a PNP transistor $117_3$, a diode $117_4$, a capacitor $117_5$, and resistors $117_6$ through $117_{13}$. The output of the filter is applied to the positive input terminal of the operational amplifier $117_1$ which constitutes a comparator. The negative input terminal of the operational amplifier $117_1$ is connected to one terminal of the solenoid coil 19 through a negative feedback resistor $117_{13}$. Because the negative input terminal and the point of the reference potential (for example the ground) is connected a capacitor $117_5$ which constitutes a delay circuit together with the negative feedback resistor $117_{13}$ as will be described later. The negative input terminal of the operational amplifier 117, is connected to one end of a resistor $117_6$ which is used for the purpose of causing the operational amplifier not to produce an output so as not to energize the solenoid coil 19 when the running speed is zero. The output of the operational amplifier $117_1$ is derived out from the junction between serially connected resistors $117_7$ and $117_8$ and applied to the base electrode of a transistor $117_2$ constituting a portion of an output amplifier circuit. The collector electrode of the transistor $117_2$ is connected to a source $+V$ through serially connected resistors $117_9$ and $117_{10}$, and the junction therebetween is connected to the base electrode of a transistor $117_3$ also constituting a portion of the amplifier circuit.

The collector-emitter circuit of transistor $117_3$ is connected across the source $+V$ and the point of reference potential in series with the solenoid coil 19 and a resistor $117_{11}$. A free wheel diode $117_4$ is connected between the collector electrode of transistor $117_3$ and the point of reference potential for discharging the electro-magnetic energy stored in the solenoid coil 19 when the transistor $117_3$ is turned OFF.

The invention is characterized in that a positive feedback resistor $117_{12}$ is connected between the collector electrode of transistor $117_3$ and the positive input terminal of the operational amplifier $117_1$. With this connection, the power amplifier 117 operates as an oscillator to supply a pulse current to the solenoid coil 19 as an exciting current. More particularly, when a DC analog signal proportional to the running speed is supplied to the positive input terminal of the operational amplifier $117_1$ from the filter 115 and when the potential of the negative input terminal is at a level lower than the DC signal, the operational amplifier $117_1$ produces a positive output to turn ON transistor $117_2$ thus lowering the potential of the junction between resistors $117_9$ and $117_{10}$. As a consequence, transistor $117_3$ is turned ON to pass exciting current through the solenoid coil 19. As the exciting current begins to flow, a positive feedback is applied to the positive input terminal of the operational amplifier $117_1$ through resistor $117_{12}$ to saturate the output of this operational amplifier. Consequently, transistors $117_2$ and $117_3$ conduct fully to pass exciting current of a predetermined value. The variation in the potential at the junction between the resistor $117_{11}$ and the solenoid coil 19 is negatively fed back to the operational amplifier $117_1$ through the negative feedback resistor $117_{13}$. Since the capacitor $117_5$ which constitutes the delay circuit together with resistor $117_{13}$ is connected to the negative input terminal of the operational amplifier $117_1$, the potential variation on the side of the solenoid coil would not be immediately transmitted to the negative input terminal of the operational amplifier $117_1$. A predetermined time after the potential of the negative input terminal of the operational amplifier exceeds that of the positive input terminal, the operational amplifier produces no output whereby both transistors $117_2$ and $117_3$ turns OFF. Consequently, an attenuating current flows through the solenoid coil which dissipates the electromagnetic energy stored therein through the free wheel diode. At this time, since the potential across the solenoid coil is reversed, a low level signal is positively fed back to the operational amplifier $117_1$ via the positive feedback resistor $117_{12}$. Also a gradually decreasing signal is negatively fed back through the negative feedback resistor $117_{13}$. Consequently, the potential of the negative input terminal of the operational amplifier $117_1$ gradually decreases according to the discharge time constant determined by capacitor $117_5$, and resistor $117_{13}$ and $117_{11}$. At an instant when this potential becomes lower than that of the positive input terminal, the operational amplifier $117_1$ again produces an output to turn ON transistors $117_2$ and $117_3$ thus passing exciting current to the solenoid coil 19. Thereafter, the operation described above is repeated.

As above described, the power amplifier 117 operates as an oscillator to pass pulse current through the solenoid coil 19 so as to ON-OFF control the transistor $117_3$ with the result that the power consumption of transistor $117_3$ is reduced to the voltage drop when it operates below saturation. Consequently, it is possible to greatly decrease the capacity of the output transistor $117_3$ and to eliminate the heat radiating fins. The ON-OFF period of the pulse shaped exciting current is determined by the width of a hysteresis determined by the charge and discharge constant provided by the negative feedback resistor $117_{13}$, resistor $117_{11}$, capacitor $117_5$ and the positive feedback resistor $117_{12}$. For instance, this period is selected to be 500 to 1000 Hz. When the exciting current is pulsed in this manner, there arises an additional advantage that the magnetic hysteresis effect produced at the time of actuating the plunger with the energizing current can be reduced.

Figure 2:
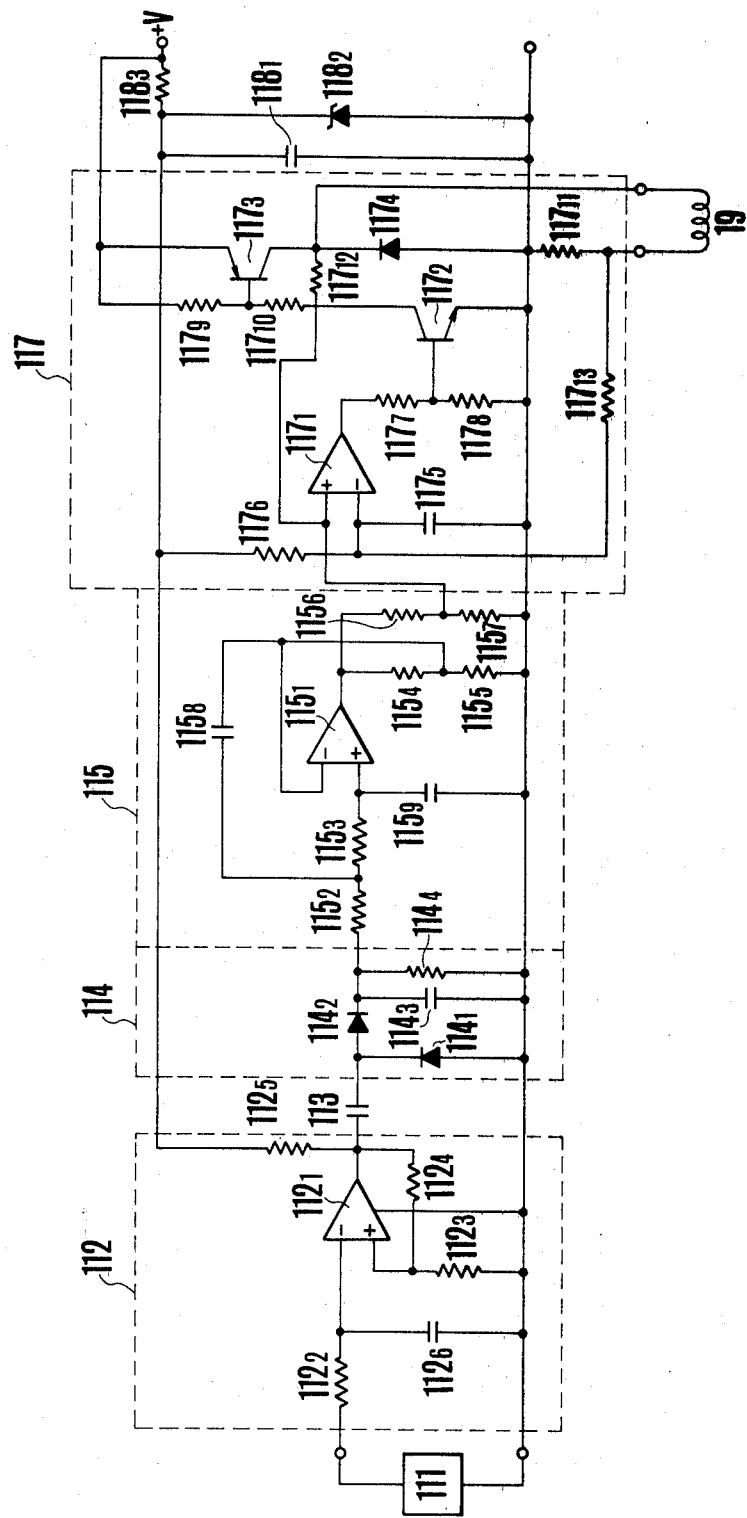
FIG. 2 is a connection diagram of a driving circuit embodying the invention and
FIGS. 3 and 4 are connection diagrams showing modified embodiment of this invention.

In FIG. 2, reference character $118_1$ designates a capacitor, $118_2$ a Zener diode, and $118_3$ a resistor which are provided for the purpose of stabilizing and regulating the source voltage.

Figure 3:
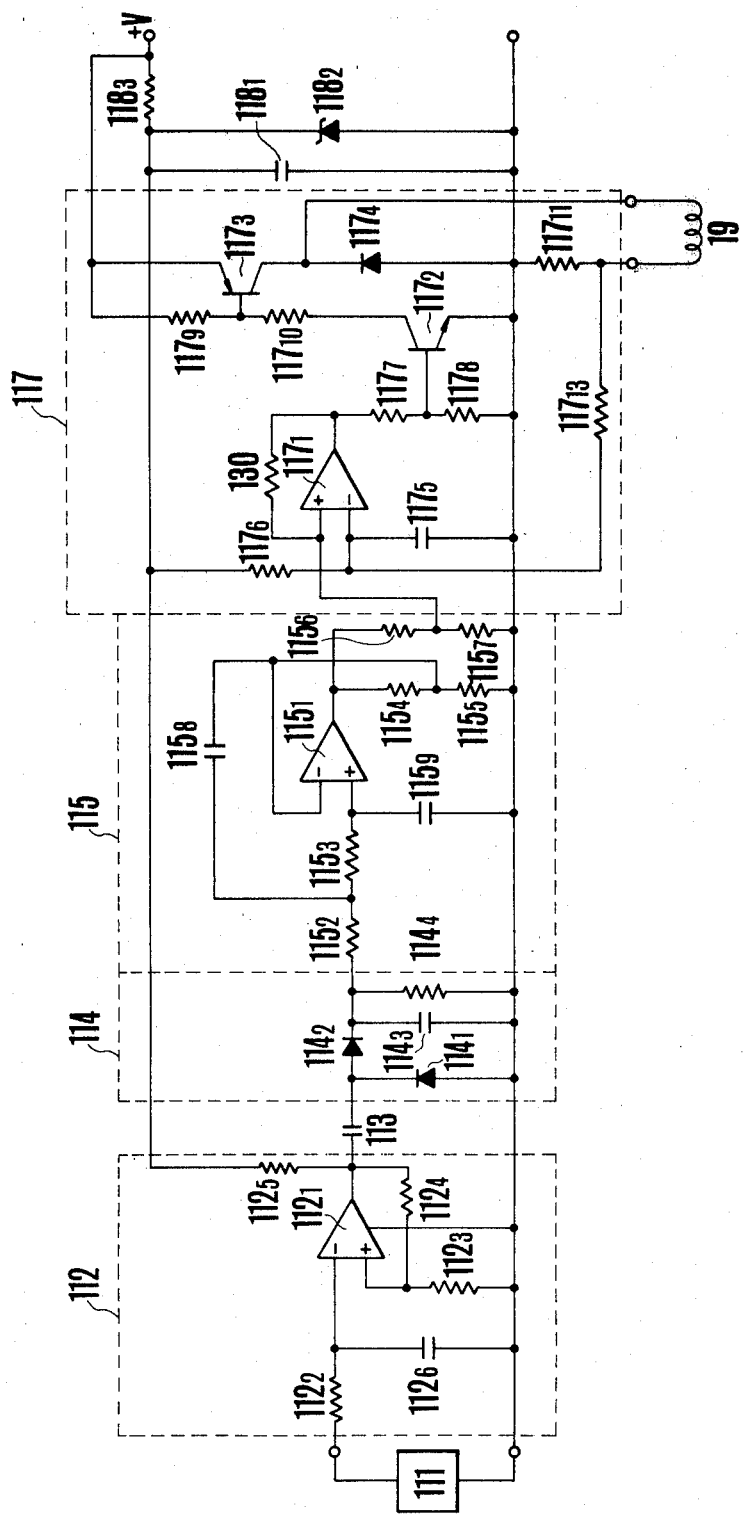

FIG. 3 shows a modification of this invention which is different from the embodiment shown in FIG. 2 in that a positive feedback resistor 130 is connected between the input and output of the operational amplifier $117_1$. It will be clear that this modification operates in the same manner as the first embodiment.

Figure 4:
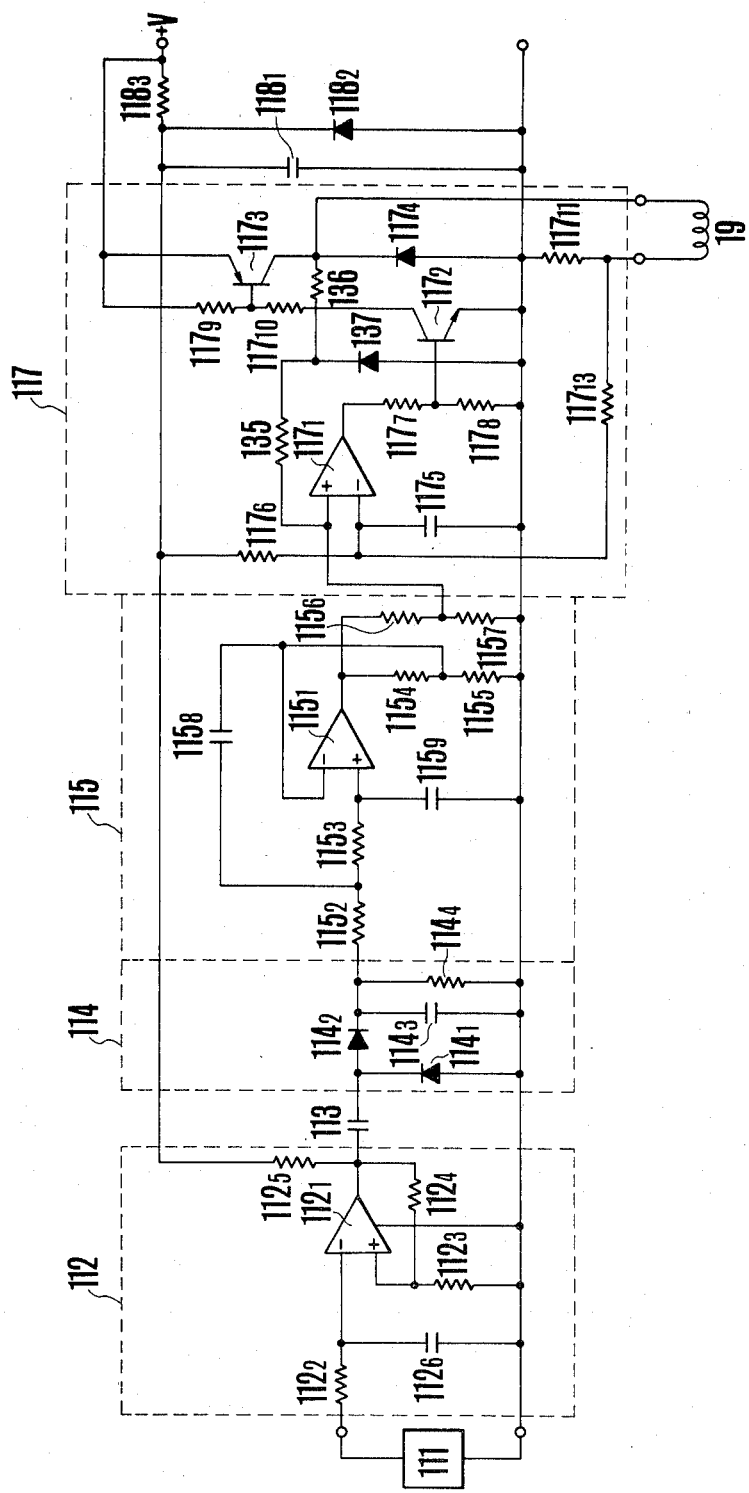

FIG. 4 shows still further modification of this invention which is different from the embodiment shown in FIG. 2 in that serially connected resistors 135 and 136 are connected between the positive input terminal of the operational amplifier $117_1$ and the collector electrode of transistor $117_3$, and that a constant voltage element, for example, a Zener diode 137, is connected between the junction between the resistors 135 and 136 and the point of reference potential. With this connection, irrespective of the variation in the source voltage it is possible to maintain the positive feedback at a constant value. Other advantages are the same as those of the embodiment shown in FIG. 2.

It should be understood that the invention is not limited to the specific embodiments described above and that many changes and modifications will be obvious to one skilled in the art. For example, in these embodiments, although the driving circuit of this invention was applied to the oil pressure control of the pressure of the oil supplied to a power steering unit of a motor car, it will be clear that the invention is also applicable to control the flow quantity of the oil supplied to the power steering unit.

As above described, in the driving circuit of this invention, the output transistor of the power amplifier circuit utilized to supply exciting current to the solenoid coil is ON-OFF controlled so that it is possible to reduce the power consumption and hence the heating of the output transistor. As a consequence, it is possible to reduce the capacity of the output transistor and to eliminate heat radiating fins. Moreover, as a pulse current is supplied to the solenoid coil, it is possible to reduce the magnetic hysteresis which occurs when the plunger is actuated by the solenoid coil.

What is claimed is:

1. In a driving circuit of a solenoid actuated device of the type wherein a plunger is actuated by a solenoid coil, the driving circuit comprising a comparator having a first input supplied with an analog control signal representing an operating condition of a member to be controlled by the plunger, a second input, and an output; and a power amplifier circuit including an output amplifier in the form of an output transistor for supplying exciting current to the solenoid coil in response to the output of the comparator, the improvement comprising means coupled to said coil for detecting a voltage corresponding to said exciting current, positive feedback means, connected between said first input of said comparator and the output of one of said comparator and said output amplifier, and negative feedback means connected between said second comparator input and a junction between said detecting means and said coil, in order to provide ON-OFF control of said output transistor such that said exciting current comprises a current proportional to said analog control signal.

2. The driving circuit according to claim 1 wherein said solenoid actuated device controls operating fluid supplied to a power steering unit of a motor car and said analog control signal is proportional to the running speed of said motor car.

3. The driving circuit according to claim 1 wherein said positive feedback means is connected between the output terminal of said power amplifier circuit and said first input terminal of said comparator.

4. The driving circuit according to claim 1 wherein said positive feedback means is connected to said output terminal of said comparator and said input terminal thereof.

5. The driving circuit according to claim 1 wherein said positive feedback means comprises two serially connected resistors connected between the output of said amplifier circuit and said first input terminal of said comparator, and wherein a constant voltage element is connected between the junction between said serially connected resistors and a point of reference potential.

* * * * *